United States Patent
Kwak

(10) Patent No.: US 7,018,885 B2
(45) Date of Patent: Mar. 28, 2006

(54) METHOD OF MANUFACTURING SEMICONDUCTOR DEVICES

(75) Inventor: Noh Yeal Kwak, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 11/076,759

(22) Filed: Mar. 10, 2005

(65) Prior Publication Data

US 2005/0233531 A1    Oct. 20, 2005

Related U.S. Application Data

(62) Division of application No. 10/616,723, filed on Jul. 10, 2003.

(30) Foreign Application Priority Data

Jul. 12, 2002    (KR) ............................... 2002-40697

(51) Int. Cl.
   *H01L 21/8238* (2006.01)
   *H01L 21/265* (2006.01)
(52) U.S. Cl. ...................... 438/217; 438/221; 438/224; 438/520
(58) Field of Classification Search ................ 438/142, 438/197, 200, 201, 217–231, 257–267, 283, 438/296, 297, 298, 358, 359, 371–374, 412, 438/418, 420–426, 518–520, 528, 162, 424
   See application file for complete search history.

(56) References Cited

U.S. PATENT DOCUMENTS 6,297,082 B1 * 10/2001 Lin et al. ..................... 438/217
2004/0106256 A1 * 6/2004 Dong et al. .................. 438/257

* cited by examiner

*Primary Examiner*—Brook Kebede
(74) *Attorney, Agent, or Firm*—Marshall, Gerstein & Borun LLP

(57) ABSTRACT

Disclosed is a method of manufacturing semiconductor devices. Before the threshold voltage ion is implanted, an inert ion having no electrical properties is implanted into the bottom of a channel region to form an anti-diffusion layer. Therefore, it is possible to prevent diffusion of an ion for adjusting the threshold voltage into the bottom of the channel region, occurring in a subsequent annealing process, and prohibit behavior of the ion at the channel region when a high voltage is applied to a P well. Further, the anti-diffusion layer serves as a layer to gather defects, etc. existing in the semiconductor substrate. Also, as the amount of channel ion could be adjusted by controlling the implantation depth of the inert ion, it is possible to control the threshold voltage of the device depending on higher integration.

5 Claims, 7 Drawing Sheets

METHOD OF MANUFACTURING SEMICONDUCTOR DEVICES

This is a division of U.S. Ser. No. 10/616,723, filed Jul. 10, 2003, the entire disclosure of which is incorporated herein by reference.

BACKGROUND OF THE INVENTION

1. Field of the Invention

The present invention relates to a method of manufacturing semiconductor devices, and more particularly, to a method of manufacturing semiconductor devices capable of preventing variation of the threshold voltage depending on internal diffusion of an ion for adjusting the threshold voltage.

2. Background of the Related Art

Recently, as the degree of integration in the memory devices is increased, the size of the memory cell is abruptly reduced. Therefore, in order to secure the ratio of the wafer to the memory cell, an isolation film using a shallow trench is employed.

In a conventional process of manufacturing the flash memory device, after a well is formed in the semiconductor substrate, a tunnel oxide film and a polysilicon layer to be used as the gate are sequentially formed. The polysilicon layer and the tunnel oxide film are then patterned by means of an isolation mask. Next, the exposed semiconductor substrate is etched, by a given depth, to form a trench of a shallow size. Thereafter, the edge portion of the trench is made rounded by annealing process under hydrogen atmosphere. A nitride film is then formed on the entire structure using $Si_3N_4$ gas. After an oxide film is thickly formed on the entire structure so that the trench is buried, a planarization process is implemented to form an isolation film within the trench.

If this conventional method is used, damage of the tunnel oxide film at the top edge of the trench does not occur. However, as a boron (B11) ion implanted in order to control the threshold voltage is experienced by transient enhanced diffusion (TED) in a subsequent annealing process, the concentration of the ion at the substrate surface is increased or reduced and the threshold voltage is thus varied. Due to this, in case of the NAND type flash memory cell in which erase is performed in the FN tunneling mode, the length of the channel is changed to lower electrical characteristics and reliability of the device. Further, as the ion for adjusting the threshold voltage is implanted in the minimum dose, the threshold voltage at the entire regions of the wafer is nit safely secured due to diffusion of the ion.

SUMMARY OF THE INVENTION

Accordingly, the present invention is contrived to substantially obviate one or more problems due to limitations and disadvantages of the related art, and an object of the present invention is to provide a method of manufacturing semiconductor devices by which before threshold voltage ion is implanted, an inert ion having no electrical properties is implanted into the bottom of a channel region to form an anti-diffusion layer.

In a preferred embodiment, a method of manufacturing semiconductor devices is according to the present invention characterized in that it comprises the steps of forming a sacrificial oxide film on a semiconductor substrate, forming a triple well on the semiconductor substrate, implanting an inert ion into the semiconductor substrate, by a given depth, to form an anti-diffusion layer, implanting an ion for adjusting the threshold voltage into the semiconductor substrate on the anti-diffusion layer, removing the sacrificial oxide film and then sequentially forming a tunnel oxide film, a polysilicon layer and a pad nitride film on the semiconductor substrate, patterning the pad nitride film by means of an isolation mask and then sequentially etching exposed portions of the polysilicon layer, the tunnel oxide film and the semiconductor substrate to form a trench, and forming an oxide film on the entire structure so that the trench is buried, planarizing the surface of the oxide film, and then removing remaining pad nitride film to form an isolation film within the trench.

In another preferred embodiment, a method of manufacturing semiconductor devices is according to the present invention characterized in that it comprises the steps of forming a sacrificial oxide film on a semiconductor substrate, forming a triple well on the semiconductor substrate, implanting an ion of a heavy weight into a channel region of the semiconductor substrate to form an ion implantation layer, implanting an ion for adjusting the threshold voltage into the ion implantation layer, removing the sacrificial oxide film and then sequentially forming a tunnel oxide film, a polysilicon layer and a pad nitride film on the semiconductor substrate, patterning the pad nitride film by means of an isolation mask and then sequentially etching exposed portions of the polysilicon layer, the tunnel oxide film and the semiconductor substrate to form a trench, and forming an oxide film on the entire structure so that the trench is buried, planarizing the surface of the oxide film, and then removing remaining pad nitride film to form an isolation film within the trench.

The inert ion is a nitrogen ion and is implanted using $NH_3$ as a source gas at the dose of 5E12~5E13 ion/$cm^2$ and with energy of 500~1500 KeV.

The ion of a heavy weight is an arsenic (As75) ion and is implanted at the dose of 5E11~5E13 ion/$cm^2$ and with energy of 10~100 KeV.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE
PREFERRED EMBODIMENT

Reference will now be made in detail to the preferred embodiments of the present invention, examples of which are illustrated in the accompanying drawings.

FIG. 1A~FIG. 1I are cross-sectional views of semiconductor devices according to a preferred embodiment of the present invention.

Figure 1A:
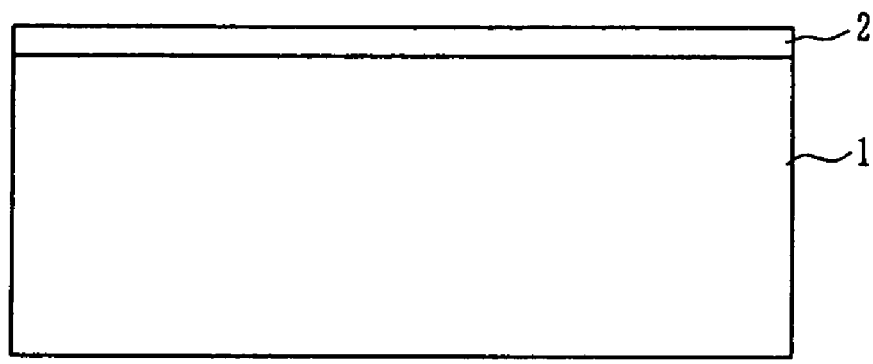
FIG. 1A~FIG. 1I are cross-sectional views of semiconductor devices according to a preferred embodiment of the present invention.

FIG. 1A illustrates the cross-sectional view of the semiconductor device in which a sacrificial oxide film 2 is formed on a semiconductor substrate 1. At this time, the sacrificial oxide film 2 is formed in a dry mode or a wet mode in order to prohibit crystal defects on the surface of the semiconductor substrate 1 and for the purpose of surface processing. For example, the sacrificial oxide film 2 is formed in thickness of 70~100 Å by means of pre-treatment cleaning process using $DHF(50:1)+SC-1(NH_4OH/H_2O_2/H_2O)$ or $BOE(100:1$ or $300:1)+SC-1(NH_4OH/H_2O_2/H_2O)$ at a temperature of 750~800° C.

Figure 1B:
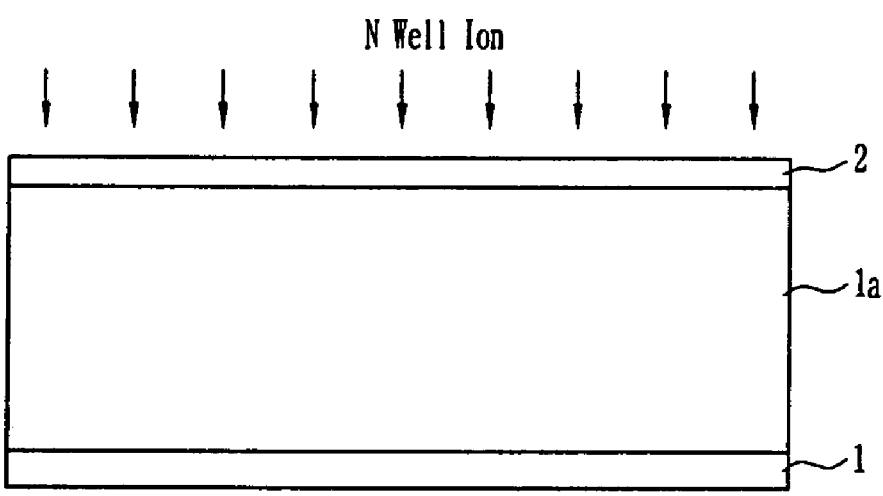
Figure 1C:
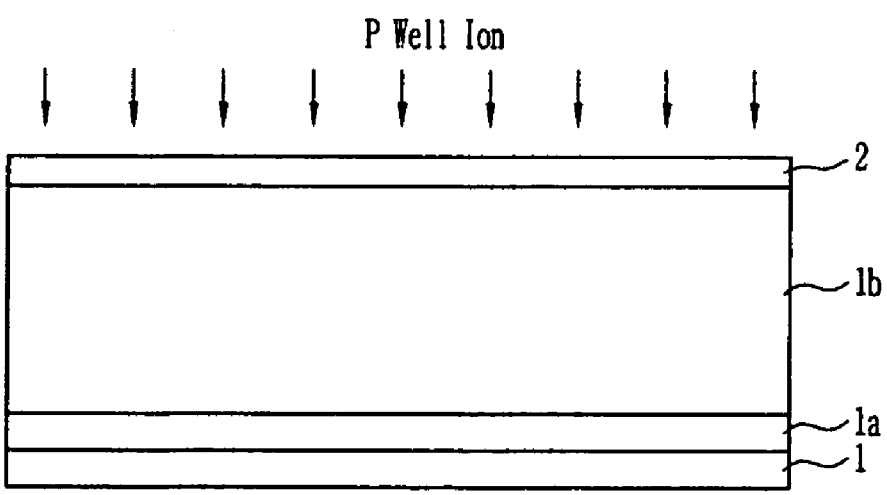

FIG. 1B illustrates the cross-sectional view of the semiconductor device in which an ion is implanted into the semiconductor substrate 1, where an N well (1a) will be formed, using a given mask. FIG. 1C illustrates the cross-sectional view of the semiconductor device in which an ion is implanted into the semiconductor substrate 1, where a P well (1b) will be formed, using a given mask. At this time, the sacrificial oxide film 2 is used as a screen oxide film for prohibiting internal diffusion due to dopant channeling.

Characteristics of the flash memory having a well of a triple well will be considered. In order to form the N well, a P31 ion is implanted at the dose of 5E12~5E13 ion/cm$^2$ with energy of 500~2000 KeV. In order to form the P well, a boron (B11) ion is implanted at the dose of 1E12~5E13 ion/cm$^2$ with energy of 200~1000 KeV. At this time, a tilt ion implantation method having a tilt angle of 3~13° is used so that channeling can be prohibited.

Figure 1D:
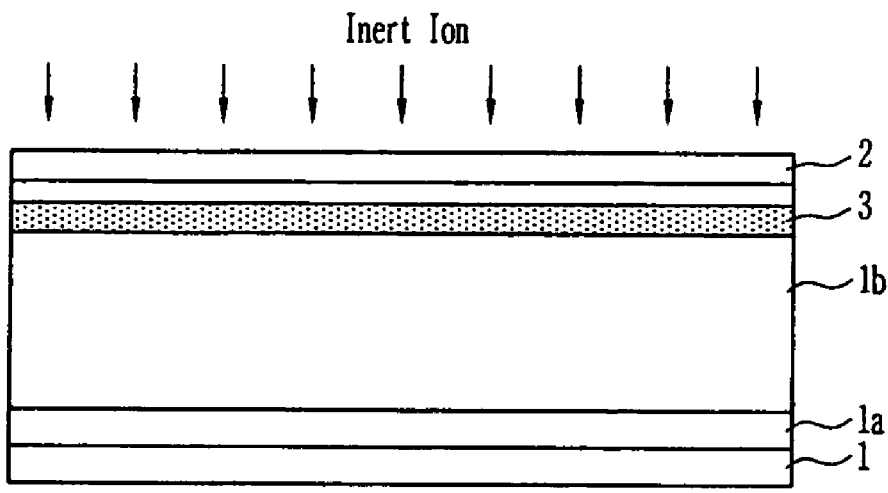

FIG. 1D illustrates the cross-sectional view of the semiconductor device in which an inert ion having no electrical properties are implanted into the semiconductor substrate 1, by a given depth, to form an anti-diffusion layer 3. At this time, the inert ion may include nitrogen ($N_2$) ion. The nitrogen ($N_2$) ion is implanted at the dose of 5E13~5E15 ion/cm$^2$ and with energy of 10~100 KeV using $NH_3$ as a source gas, wherein the nitrogen ion is implanted at a tilt angle of 3~13° so that channeling can be prohibited by maximum.

Figure 1E:
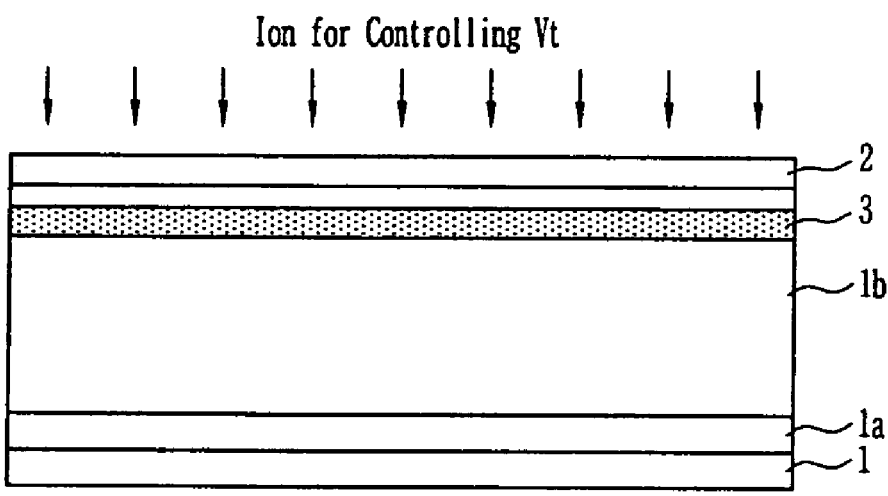
Figure 2:
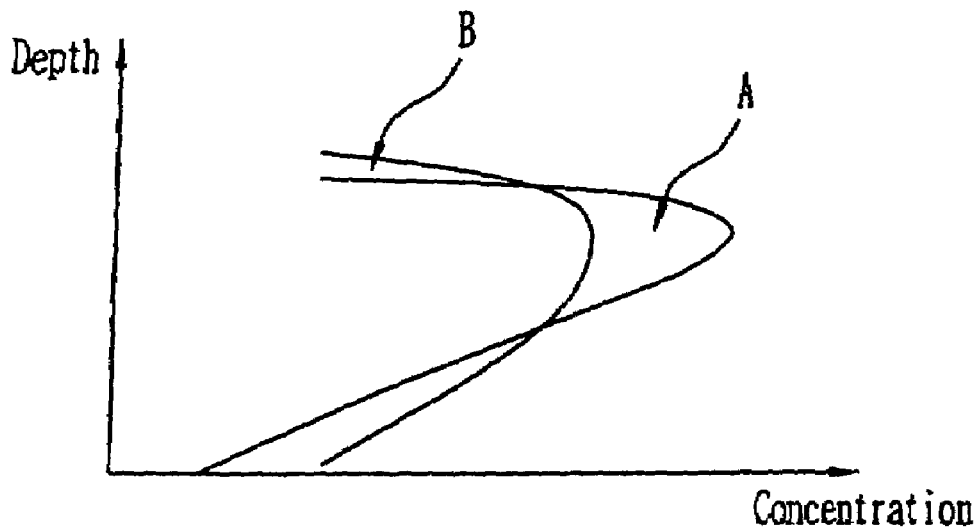
FIG. 2 is a graph illustrating distribution of concentration at the anti-diffusion layer according to the present invention.

FIG. 1E illustrates the cross-sectional view of the semiconductor device in which a P type ion is implanted into the channel region on the surface of the semiconductor substrate 1 in order to control the threshold voltage (Vt). The P type ion may include a boron (B11) ion and is implanted at the dose of 1E11~1E13 ion/cm$^2$ with energy of 5~50 KeV, wherein the P type ion is implanted by means of the tilt ion implantation method having a tilt angle of 3~13° so that channeling can be prohibited by maximum. At this time, a projected range (Rp) is controlled so that the P type ion is not implanted into the bottom of the anti-diffusion layer 3, as in FIG. 2. In FIG. 2, a line "A" indicates the depth and distribution of concentration of the anti-diffusion layer 3 and a line "B" indicates the depth and distribution of concentration of the region into which the ion for adjusting the threshold voltage is implanted.

Figure 1F:
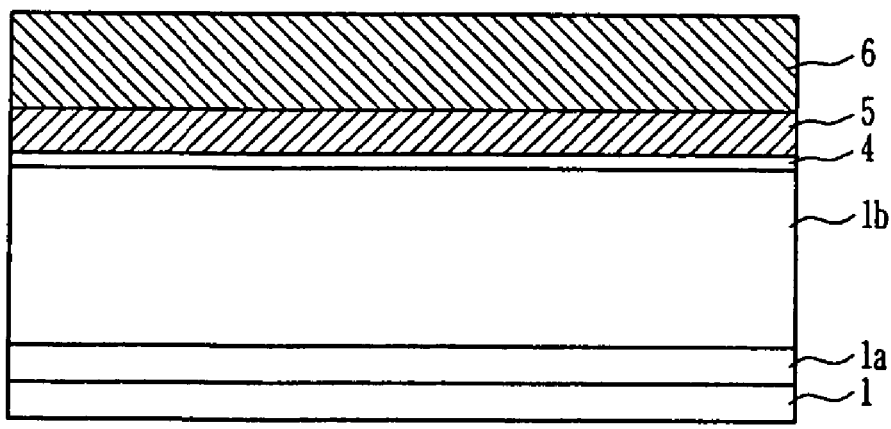

FIG. 1F illustrates the cross-sectional view of the semiconductor device in which the sacrificial oxide film 2 is removed, and a tunnel oxide film 4, a polysilicon layer 5 and a pad nitride film 6 are then sequentially formed on the semiconductor substrate 1.

The sacrificial oxide film 2 is removed by the pre-treatment cleaning process using $DHF(50:1)+SC-1(NH_4OH/H_2O_2/H_2O)$. The tunnel oxide film 4 is formed in a wet mode at a temperature of 750~800° C. and is then annealed under $N_2$ atmosphere at a temperature of 900~910° C. for 20~30 minutes.

Further, the polysilicon layer 5 is formed by depositing doped polysilicon the grain size of which is minimized, in thickness of 250~500 Å, by means of a low-pressure chemical vapor deposition (LP-CVD) method using $SiH_4$ or $Si_2H_6$ and $PH_3$ gas at a pressure condition of 0.1~3 torr and a temperature of 580~620° C., wherein the deposition process is performed to keep the P doping level of about 1.5E20~3.0E20 atoms/cc.

The pad nitride film 6 is formed in thickness of 900~2000 Å by means of the low-pressure chemical vapor deposition (LP-CVD) method.

Figure 1G:
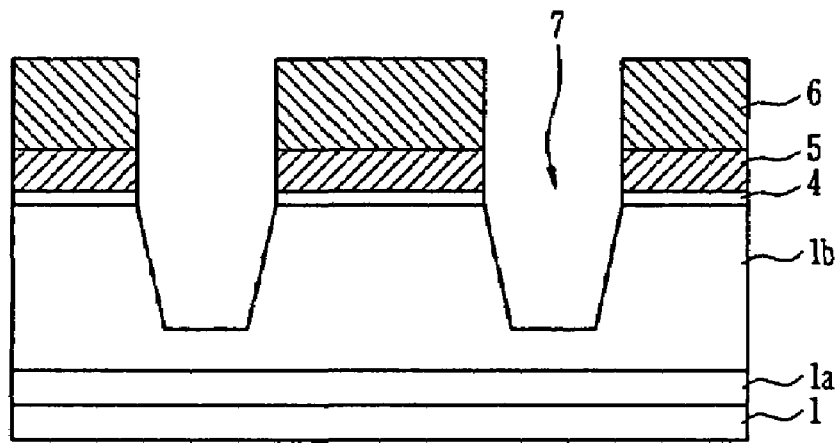

FIG. 1G illustrates the cross-sectional view of the semiconductor device in which the pad nitride film 6 is patterned by means of photography and etch processes using the isolation mask, and the polysilicon layer 5, the tunnel oxide film 4 and the semiconductor substrate 1 at the exposed portion are then sequentially etched to form a trench 7 of a shallow size. At this time, the sidewall of the trench 7 is etched to have a given tilt angle.

Figure 1H:
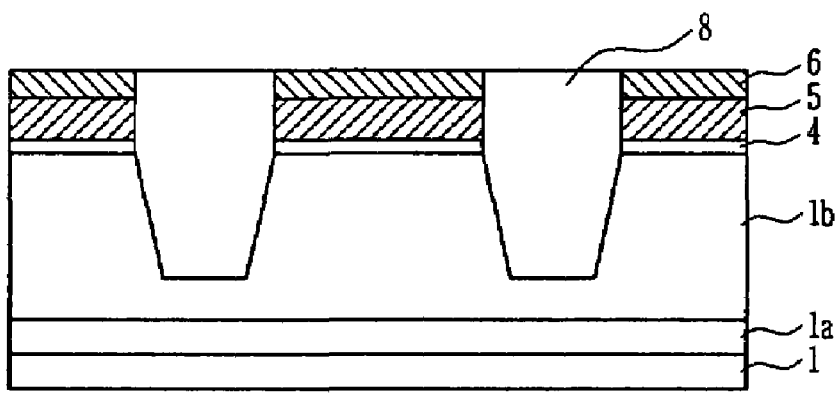

FIG. 1H illustrates the cross-sectional view of the semiconductor device in which a high density plasma oxide film 8 is formed on the entire structure in thickness of 4000~10000 Å so that the trench 7 is buried and is then planarized by means of chemical mechanical polishing process. At this time, the pad nitride film 6 is polished in a given thickness.

Figure 1I:
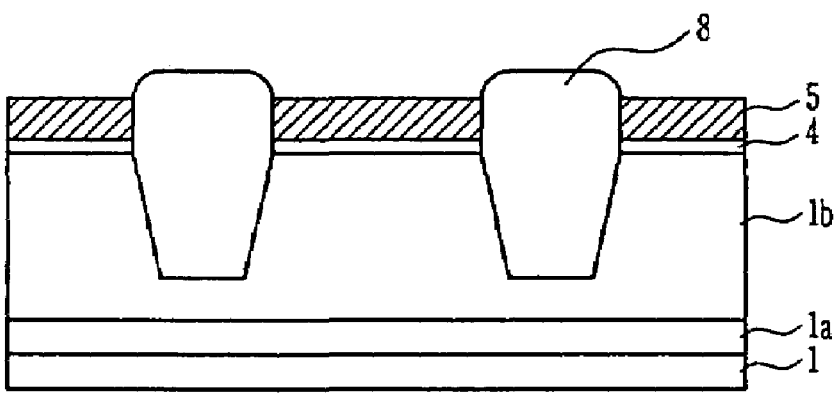

FIG. 1I illustrates the cross-sectional view of the semiconductor device in which an isolation film 8 is formed within the trench 7, by dipping the semiconductor substrate 1 into phosphoric acid ($H_3PO_4$) in order to remove the pad nitride film 6.

Thereafter, a native oxide film (not shown) grown on the surface of the exposed polysilicon layer 5 is removed using diluted HF (50:1) solution. Polysilicon is then deposited on the polysilicon layer 5 in thickness of 400~1000 Å in order to obtain a floating gate of a given thickness. Next, the flash memory cell is formed according to the common process of manufacturing the flash memory device.

FIG. 3A~FIG. 3I are cross-sectional views of semiconductor devices according to another preferred embodiment of the present invention.

Figure 3A:
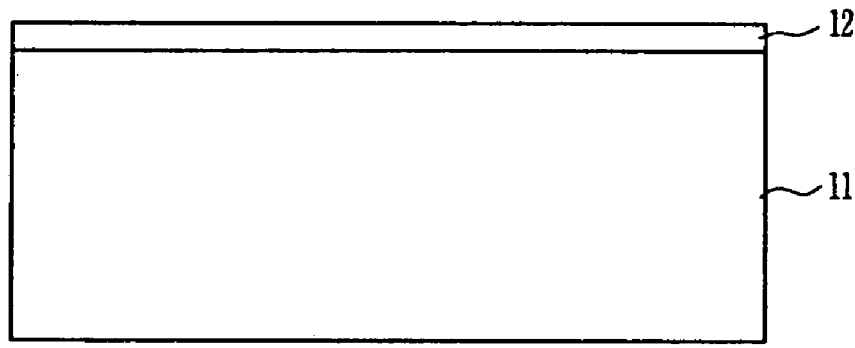
FIG. 3A~FIG. 3I are cross-sectional views of semiconductor devices according to another preferred embodiment of the present invention.

FIG. 3A illustrates the cross-sectional view of the semiconductor device in which a sacrificial oxide film 12 is formed on a semiconductor substrate 11. The sacrificial oxide film 12 is formed in a dry mode or a wet mode in order to prohibit crystal defects on the surface of the semiconductor substrate 1 and for the purpose of surface processing. For example, the sacrificial oxide film 12 is formed in thickness of 70~100 Å by means of pre-treatment cleaning process using $DHF(50:1)+SC-1(NH_4OH/H_2O_2/H_2O)$ or $BOE(100:1$ or $300:1)+SC-1(NH_4OH/H_2O_2/H_2O)$ at a temperature of 750~800° C.

Figure 3B:
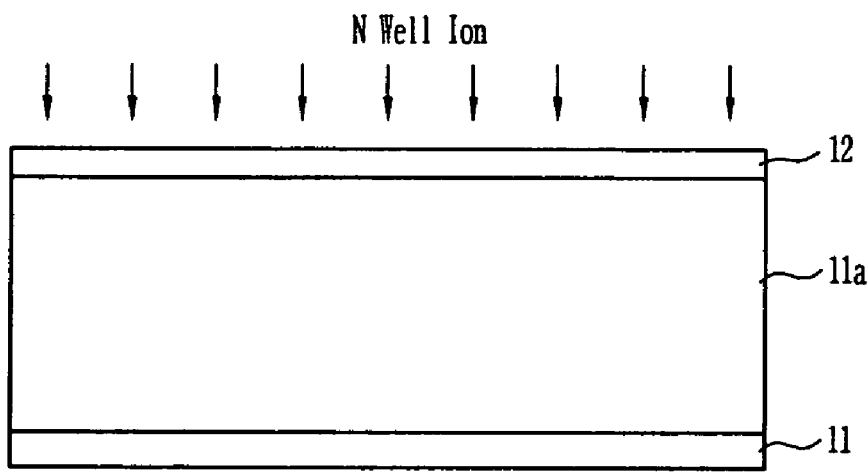
Figure 3C:
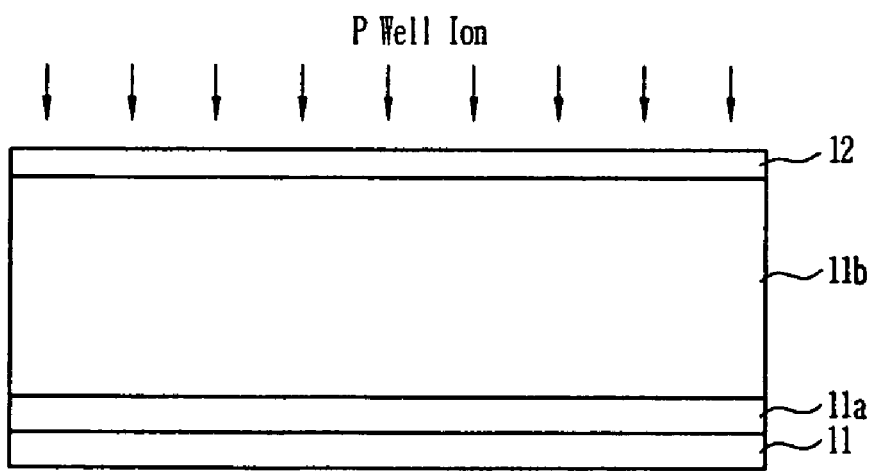

FIG. 3B illustrates the cross-sectional view of the semiconductor device in which an ion is implanted into the semiconductor substrate 11, where an N well (1a) will be formed, using a given mask. FIG. 3C illustrates the cross-sectional view of the semiconductor device in which an ion is implanted into the semiconductor substrate 11, where a P well (1b) will be formed, using a given mask. At this time, the sacrificial oxide film 12 is used as a screen oxide film for prohibiting internal diffusion due to dopant channeling.

Characteristics of the flash memory having a well of a triple well will be considered. In order to form the N well, a P31 ion is implanted at the dose of 5E12~5E13 ion/cm$^2$ with energy of 500~2000 KeV. In order to form the P well, a boron (B11) ion is implanted at the dose of 1E12~5E13 ion/cm$^2$ with energy of 200~1000 KeV. At this time, a tilt ion implantation method having a tilt angle of 3~13° is used so that channeling can be prohibited.

Figure 3D:
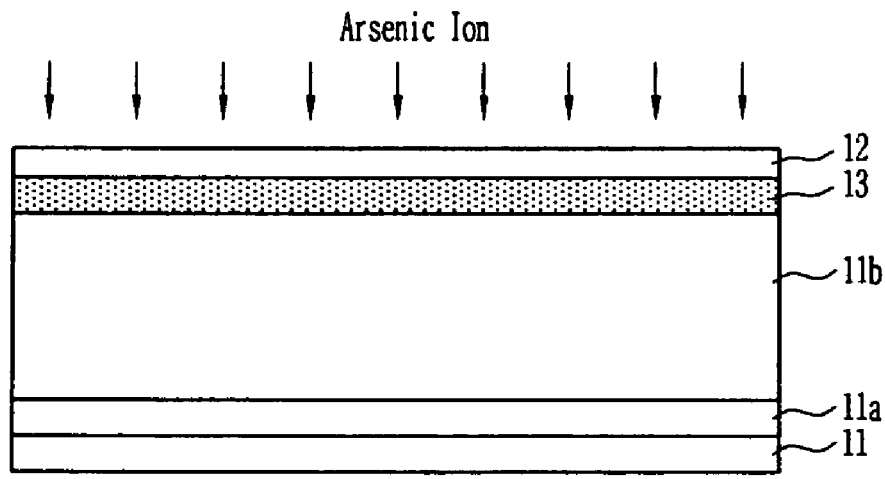

FIG. 3D illustrates the cross-sectional view of the semiconductor device in which an ion of a heavy weight is implanted into the channel region on the surface of the semiconductor substrate 11 to form an ion implantation layer 13, in order to artificially lower the threshold voltage (Vt). At this time, the ion may include an arsenic (As75) ion. Further, the ion is implanted at the dose of 5E11~5E13 ion/cm$^2$ and with energy of 10~100 KeV using an ion implanter of a high current, wherein the ion is implanted at a tilt angle of 3~13° so that channeling can be prohibited by maximum. At this time, it is required that the ion be implanted so that defects are not formed at the channel region.

Figure 4:
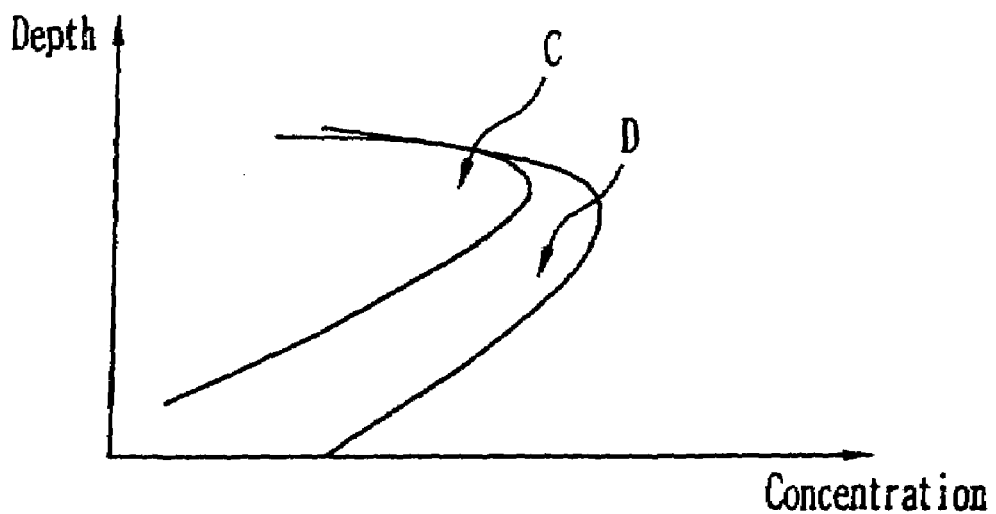
FIG. 4 is a graph illustrating distribution of concentration at the anti-diffusion layer according to the present invention.
Figure 3E:
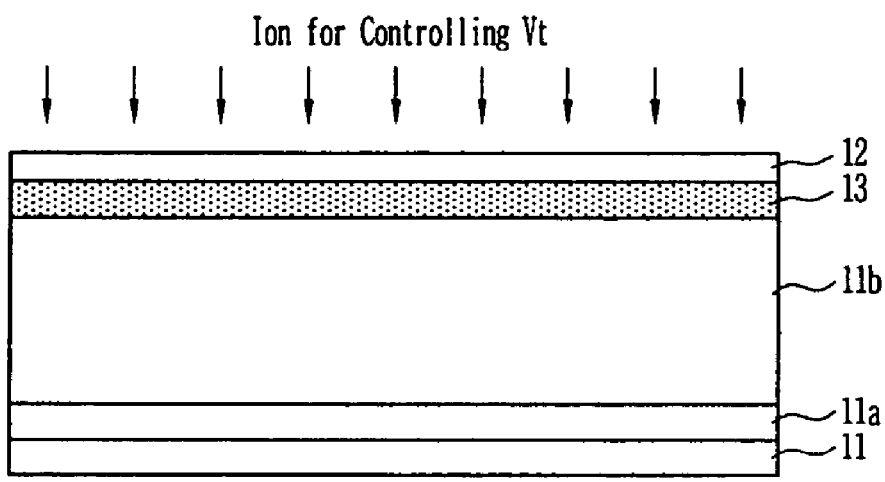

FIG. 3E illustrates the cross-sectional view of the semiconductor device in which a P type ion is implanted into the ion implantation layer 13 on the surface of the semiconductor substrate 11 in order to control the threshold voltage (Vt). The P type ion may include a boron (B11) ion and is implanted at the dose of 1E11~1E13 ion/cm$^2$ with energy of 5~50 KeV, wherein the P type ion is implanted by means of the tilt ion implantation method having a tilt angle of 3~13° so that channeling can be prohibited by maximum. At this time, as shown in FIG. 4, it is required that more P type ion be implanted than the arsenic (As75) ion. In FIG. 4, a line "C" indicates the depth and distribution of concentration of the ion implantation layer 13 and a line "D" indicates the depth and distribution of concentration of the region into which the ion for adjusting the threshold voltage is implanted.

Figure 3F:
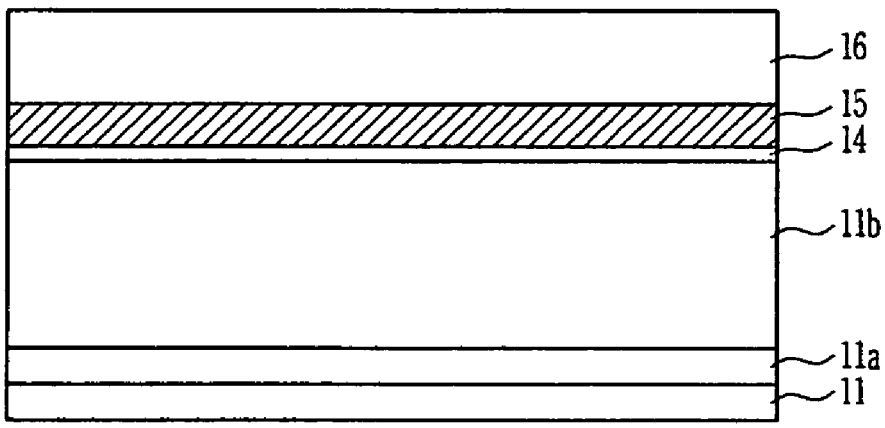

FIG. 3F illustrates the cross-sectional view of the semiconductor device in which the sacrificial oxide film 12 is removed, and a tunnel oxide film 14, a polysilicon layer 15 and a pad nitride film 16 are then sequentially formed on the semiconductor substrate 11.

The sacrificial oxide film 12 is removed by the pretreatment cleaning process using DHF(50:1)+SC-1 (NH$_4$OH/H$_2$O$_2$/H$_2$O). The tunnel oxide film 14 is formed in a wet mode at a temperature of 750~800° C. and is then annealed under N$_2$ atmosphere at a temperature of 900~910° C. for 20~30 minutes.

Further, the polysilicon layer 15 is formed by depositing doped polysilicon the grain size of which is minimized, in thickness of 250~500 Å, by means of a low-pressure chemical vapor deposition (LP-CVD) method using SiH$_4$ or Si$_2$H$_6$ and PH$_3$ gas at a pressure condition of 0.1~3 torr and a temperature of 580~620° C., wherein the deposition process is performed to keep the P doping level of about 1.5E20~3.0E20 atoms/cc.

The pad nitride film 16 is formed in thickness of 900~2000 Å by means of the low-pressure chemical vapor deposition (LP-CVD) method.

Figure 3G:
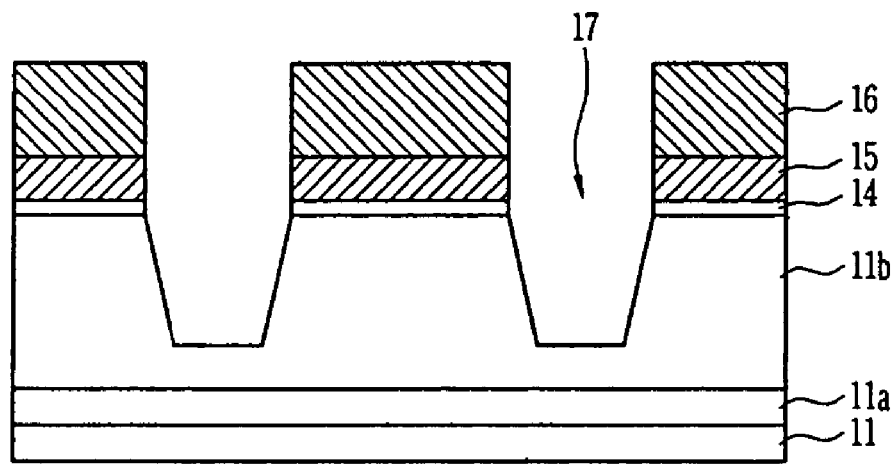

FIG. 3G illustrates the cross-sectional view of the semiconductor device in which the pad nitride film 16 is patterned by means of photography and etch processes using the isolation mask, and the polysilicon layer 15, the tunnel oxide film 14 and the semiconductor substrate 11 at the exposed portion are then sequentially etched to form a trench 17 of a shallow size. At this time, the sidewall of the trench 17 is etched to have a given tilt angle.

Figure 3H:
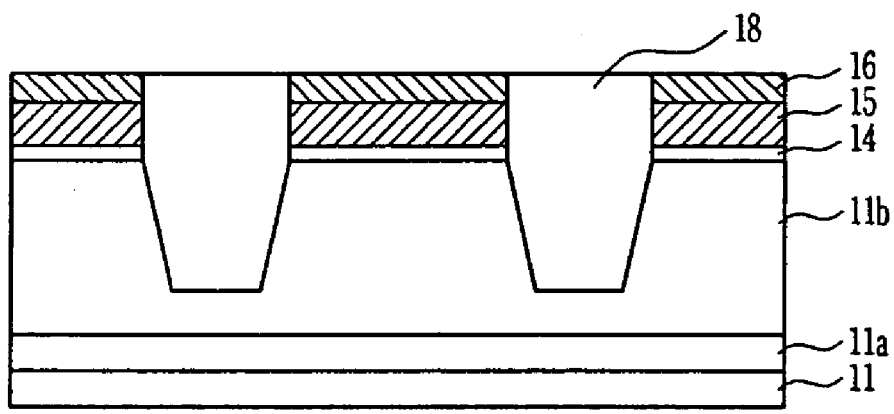

FIG. 3H illustrates the cross-sectional view of the semiconductor device in which a high density plasma oxide film 18 is formed on the entire structure in thickness of 4000~10000 Å so that the trench 17 is buried and is then planarized by means of chemical mechanical polishing process. At this time, the pad nitride film 16 is polished in a given thickness.

Figure 3I:
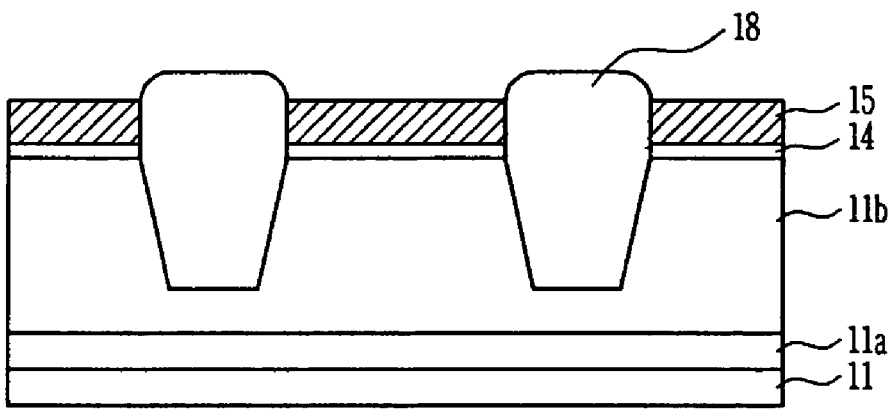

FIG. 3I illustrates the cross-sectional view of the semiconductor device in which an isolation film 18 is formed within the trench 17, by dipping the semiconductor substrate 11 into phosphoric acid (H$_3$PO$_4$) in order to remove the pad nitride film 16.

Thereafter, a native oxide film (not shown) grown on the surface of the exposed polysilicon layer 15 is removed using diluted HF (50:1) solution. Polysilicon is then deposited on the polysilicon layer 15 in thickness of 400~1000 Å in order to obtain a floating gate of a given thickness. Next, the flash memory cell is formed according to the common process of manufacturing the flash memory device.

As described above, according to the present invention, before the ion for adjusting the threshold voltage is implanted, an inert ion having no electrical properties is implanted into the bottom of a channel region, thus forming an anti-diffusion layer. Therefore, the present invention has advantageous effects that it can prevent diffusion of the ion for adjusting the threshold voltage into the bottom of the channel region in a subsequent annealing process and prohibit behavior of the ion at the channel region when a high voltage is applied to a P well.

Further, the anti-diffusion layer of the present invention serves as a layer to gather defects, etc. existing in the semiconductor substrate. Also, the amount of the channel ion can be adjusted by controlling the implantation depth of the inert ion. Therefore, the present invention has an advantageous effect that it can easily control a threshold voltage condition depending on higher integration.

In addition, according to the present invention, before the threshold voltage ion is implanted, an ion of a heavy weight is implanted into the channel region. Accordingly, the present invention has advantageous effects that it can prevent diffusion of the ion into the channel region since behavior of the ion for adjusting the threshold voltage is prohibited in a subsequent annealing process, and artificially lower the threshold voltage in a long channel. Also, the amount of the channel ion could be adjusted by controlling the implantation depth of the ion. Therefore, the present invention has an advantageous effect that it can easily control the threshold voltage condition depending on higher integration.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing semiconductor devices, comprising the steps of:

forming a sacrificial oxide film on a semiconductor substrate;

forming a triple well on the semiconductor substrate;

implanting an ion of a heavy weight into a channel region of the semiconductor substrate to form an ion implantation layer;

implanting an ion for adjusting a threshold voltage into the ion implantation layer;

removing the sacrificial oxide film and then sequentially forming a tunnel oxide film, a polysilicon layer and a pad nitride film on the semiconductor substrate;

patterning the pad nitride film by means of an isolation mask and then sequentially etching exposed portions of the polysilicon layer, the tunnel oxide film and the semiconductor substrate to form a trench; and forming an oxide film on the entire structure so that the trench is buried, planarizing the surface of the oxide film, and then removing remaining pad nitride film to form an isolation film within the trench.

2. The method as claimed in claim 1, wherein the ion of a heavy weight is an arsenic (As75) ion and is implanted at the dose of 5E11~5E13 ion/cm$^2$ and with energy of 10~100 KeV.

3. The method as claimed in claim 1, wherein the sacrificial oxide film is formed in thickness of 70~100 Å by means of cleaning process using a mixed solution of DHF (50:1)+SC-1($NH_4OH/H_2O_2/H_2O$), or BOE(100:1 or 300:1)+SC-1($NH_4OH/H_2O_2/H_2O$) at a temperature of 750~800° C.

4. The method as claimed in claim 1, wherein the ion for adjusting the threshold voltage is a boron (B11) ion and is implanted at the dose of and 1E11~1E13 ion/cm$^2$.

5. The method as claimed in claim 1, wherein the sacrificial oxide film is removed by cleaning process us DHF (50:1)+SC-1($NH_4OH/H_2O_2/H_2O$).

* * * * *

UNITED STATES PATENT AND TRADEMARK OFFICE
CERTIFICATE OF CORRECTION

PATENT NO. : 7,018,885 B2 Page 1 of 1
APPLICATION NO. : 11/076759
DATED : March 28, 2006
INVENTOR(S) : Noh Yeal Kwak It is certified that error appears in the above-identified patent and that said Letters Patent is hereby corrected as shown below:

At column 8, line 16, "us" should be --using--.

Signed and Sealed this

Thirteenth Day of February, 2007

JON W. DUDAS
*Director of the United States Patent and Trademark Office*